United States Patent [19]
Prall

[11] Patent Number: 6,083,799
[45] Date of Patent: *Jul. 4, 2000

[54] SEMICONDUCTOR PROCESSING METHOD OF FORMING A FIELD EFFECT TRANSISTOR

[75] Inventor: Kirk Prall, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/023,660

[22] Filed: Feb. 9, 1998

Related U.S. Application Data

[63] Continuation of application No. 08/740,162, Oct. 28, 1996, Pat. No. 5,733,709, which is a continuation of application No. 08/512,804, Aug. 9, 1995, Pat. No. 5,597,746.

[51] Int. Cl.$^7$ .................................................. H01L 21/336
[52] U.S. Cl. ........................ 438/300; 438/301; 438/592; 438/595
[58] Field of Search .................................. 438/300, 301, 438/592, 595

[56] References Cited

U.S. PATENT DOCUMENTS

| | | |
|---|---|---|
| 5,304,829 | 4/1994 | Mori et al. . |
| 5,306,657 | 4/1994 | Yang ......................................... 437/52 |
| 5,331,190 | 7/1994 | Shimoji et al. . |
| 5,341,010 | 8/1994 | Shimoji . |
| 5,364,807 | 11/1994 | Hwang ..................................... 437/44 |
| 5,376,578 | 12/1994 | Hsu et al. . |
| 5,597,746 | 1/1997 | Prall . |
| 5,604,367 | 2/1997 | Yang . |
| 5,633,522 | 5/1997 | Dorleans et al. . |
| 5,733,709 | 3/1998 | Prall . |
| 5,770,485 | 6/1998 | Gardner et al. . |
| 5,780,327 | 7/1998 | Chu et al. . |
| 5,851,883 | 12/1998 | Gardner et al. . |
| 5,904,529 | 5/1999 | Gardner et al. . |
| 5,923,998 | 7/1999 | Liu . |
| 5,924,000 | 7/1999 | Linliu . |

*Primary Examiner*—John F. Niebling
*Assistant Examiner*—Jonathan Hack
*Attorney, Agent, or Firm*—Wells, St. John, Roberts, Gregory & Matkin

[57] ABSTRACT

A method of forming a field effect transistor relative to a semiconductor substrate, where the transistor has a gate which defines a resultant lateral expanse of semiconductive material therebeneath for provision of a transistor channel region, includes a) providing a conductive gate layer over a semiconductor substrate; b) patterning the conductive gate layer into a first gate block, the first gate block having a first lateral expanse which is greater than the resultant lateral expanse; c) providing an insulating dielectric layer over the first gate block; d) providing a patterned layer of photoresist over the first gate block and the insulating dielectric layer, the patterned photoresist comprising a photoresist block positioned over and within the first lateral expanse of the first gate block; e) with the patterned photoresist in place, etching the insulating dielectric layer selectively relative to the first gate block; f) after etching the insulating dielectric layer and with the patterned photoresist in place, etching the first gate block selectively relative to the insulating dielectric layer to define the transistor gate having a second lateral expanse adjacent the substrate which is equal to the resultant lateral expanse; and g) providing a conductivity enhancing impurity into the substrate adjacent the transistor gate. The invention has particular utility in fabrication of field effect transistors having an elevated source and an elevated drain. The invention also contemplates products produced by the above process.

8 Claims, 8 Drawing Sheets

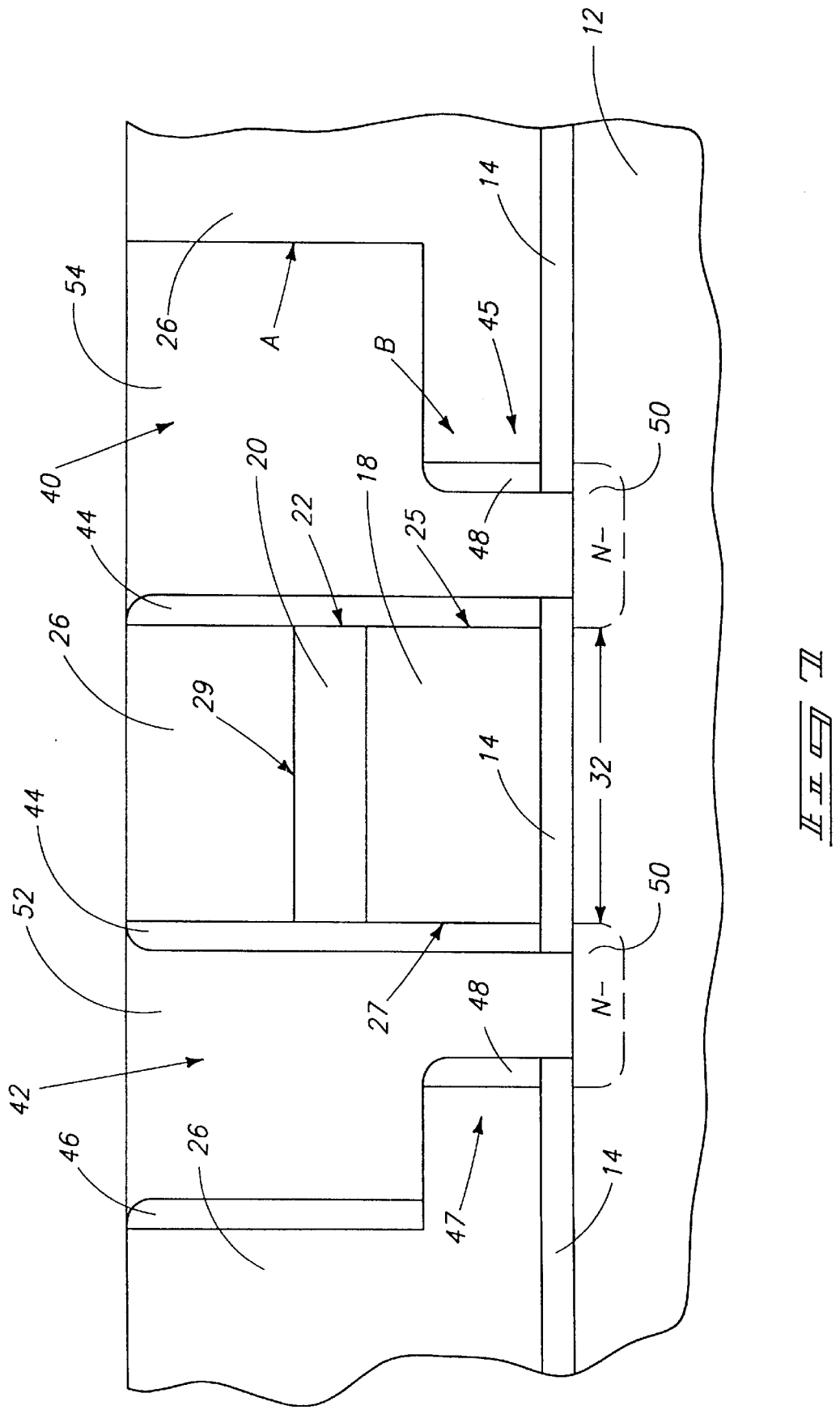

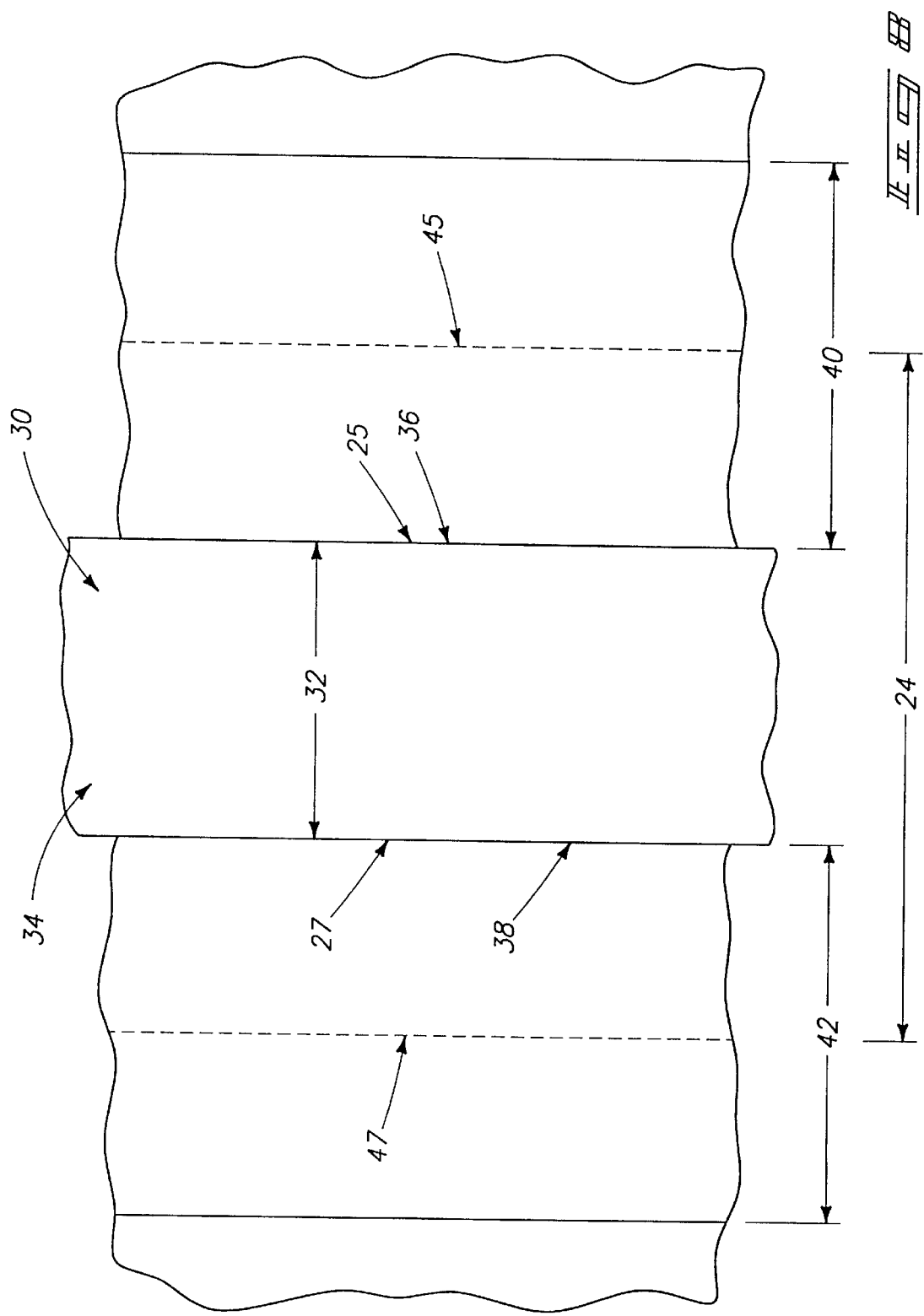

SEMICONDUCTOR PROCESSING METHOD OF FORMING A FIELD EFFECT TRANSISTOR

RELATED PATENT DATA

This patent is a continuation of prior application Ser. No. 08/740,162, now U.S. Pat. No. 5,733,709 filed on Oct. 28, 1996, which is a continuation of prior application Ser. No. 08/512,804, filed on Aug. 9, 1995, and now U.S. Pat. No. 5,597,746.

TECHNICAL FIELD

This invention relates generally to field effect transistors and to methods of fabricating field effect transistors.

BACKGROUND OF THE INVENTION

Field effect transistors are comprised of a pair of diffusion regions, referred to as a source and a drain, spaced apart within a semiconductive substrate. Such include a gate provided adjacent the separation region and between the diffusion regions for imparting an electric field to enable current to flow between the diffusion regions. The substrate area adjacent the gate and between the diffusion regions is referred to as the channel. The semiconductive substrate typically comprises a bulk monocrystalline silicon substrate having a light conductivity dopant impurity concentration. Alternately, the substrate can be provided in the form of a thin layer of lightly doped semiconductive material over an underlying insulating layer. Such are commonly referred to as semiconductor-on-insulator (SOI) constructions.

Integrated circuitry fabrication technology continues to strive to increase circuit density, and thereby minimize the size and channel lengths of field effect transistors. Improvements in technology have resulted in reduction of field effect transistor size from long-channel devices (i.e., channel lengths greater than 2 microns) to short-channel devices (i.e., channel lengths less than 2 microns).

As field effect transistor channel lengths (i.e., gate widths) became smaller than about 3 microns, so-called short channel effects began to become increasingly significant. As a result, device design and consequently process technology had to be modified to take these effects into account so that optimum device performance could continue to be obtained. For example, as device dimensions are reduced and the supply voltage remains constant, the lateral electric field generated within the substrate increases. If the field becomes strong enough, it can give rise to so-called hot-carrier effects. This becomes a significant problem with channel lengths smaller than 1.5 microns. Hot-carrier effects cause unacceptable performance degradation in n-type transistor devices built with conventional drain structures if their channel lengths are less than 2 microns.

A preferred method of overcoming this problem is to provide lightly doped drain (LDD) regions within the substrate relative to the channel region in advance of the source and drain regions. The LDD regions are provided to be lighter conductively doped (i.e., less concentration) than the source and drain regions. This facilitates sharing of the voltage drop by the drain in the channel, as opposed to the stark voltage drop at the channel occurring in non-LDD n-type transistors. The LDD regions absorb some of the voltage drop potential into the drain, thus effectively eliminating hot carrier effects. As a result, the stability of the device is increased.

However, further shrinking of the gate width (i.e., shorter channel length) makes the LDD region of a conventional transistor less effective. For example, shorter channel lengths require the LDD length to be reduced to ensure sufficient semiconductive material between the diffusion regions to prevent conductance when the gate voltage is off. One way of attending to such problems is to displace the predominant portion of the source and drain regions outwardly away from the substrate by elevating them. For example, a thin (e.g., 200-nm) epitaxial layer of monocrystalline silicon can be selectively grown from an exposed monocrystalline source and drain substrate areas within an epi reactor, and provided with sufficiently high conductivity doping to effectively provide source and drain regions. The lighter doped LDD regions can be provided within the substrate immediately below the elevated source and drain. Thus, a channel of sufficient length is effectively provided despite the smaller width gate.

One preferred prior art method for providing elevated sources and drains is to first provide a contact opening within an insulating dielectric layer immediately adjacent a word line over the desired source and drain regions. The word line is encapsulated in an insulative nitride material, with the insulating dielectric layer through which the contact openings are provided comprising borophosphosilicate (BPSG). Ideally, etch chemistry for the contact etching through the BPSG layer is selected to be highly selective to the nitride, thereby preventing word line etch rendering the process substantially self-aligning to the word line. One drawback, however, is an inherent difficulty in etching BPSG selectively relative to a nitride encapsulated word line.

Accordingly, it would be desirable to overcome certain of these drawbacks of the prior art. The invention arose primarily out of concerns associated with providing field effect transistors having elevated sources and elevated drains, and having nitride encapsulated word lines. However, the artisan will appreciate applicability of the invention to other aspects of semiconductor processing with the invention only being limited by the accompanying claims appropriately interpreted in accordance with the doctrine of equivalents.

BRIEF DESCRIPTION OF THE DRAWINGS

Preferred embodiments of the invention are described below with reference to the following accompanying drawings.

FIG. 7 is a view of the FIG. 1 wafer fragment at a processing step subsequent to that shown by FIG. 6.

FIG. 8 is a top view of FIG. 7.

DETAILED DESCRIPTION OF THE PREFERRED EMBODIMENTS

Figure 1:
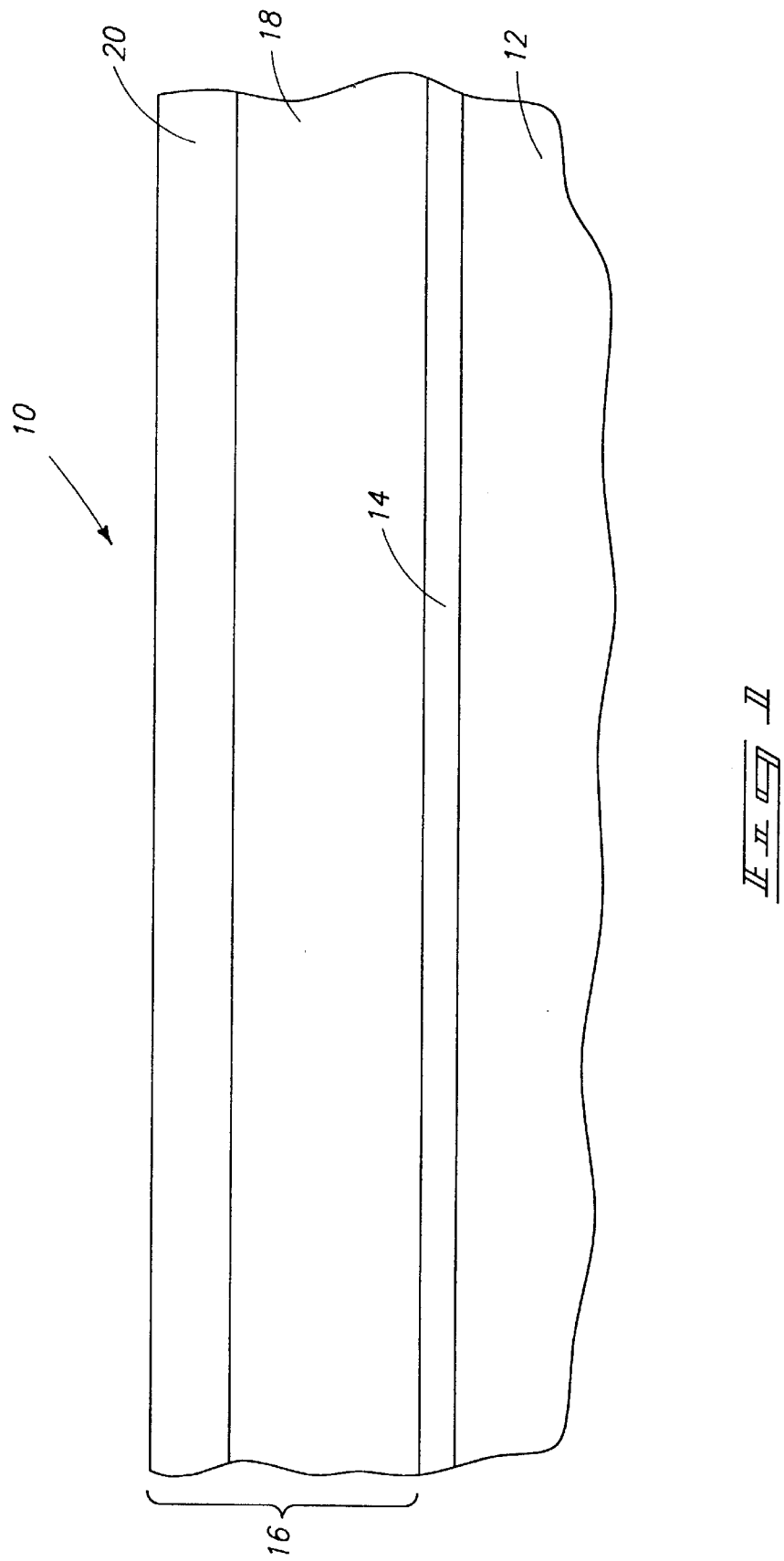
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a method of forming a field effect transistor relative to a semiconductor substrate, the transistor having a gate which defines a resultant lateral expanse of semiconductive material thereneath for provision of a transistor channel region, includes the following steps:

providing a conductive gate layer over a semiconductor substrate;

patterning the conductive gate layer into a first gate block, the first gate block having a first lateral expanse which is greater than the resultant lateral expanse;

providing an insulating dielectric layer over the first gate block;

providing a patterned layer of photoresist over the first gate block and the insulating dielectric layer, the patterned photoresist comprising a photoresist block positioned over and within the first lateral expanse of the first gate block;

with the patterned photoresist in place, etching the insulating dielectric layer selectively relative to the first gate block;

after etching the insulating dielectric layer and with the patterned photoresist in place, etching the first gate block selectively relative to the insulating dielectric layer to define the transistor gate having a second lateral expanse adjacent the substrate which is equal to the resultant lateral expanse; and providing a conductivity enhancing impurity into the substrate adjacent the transistor gate.

In accordance with another aspect of the invention, a method of forming a field effect transistor relative to a semiconductor substrate, where the transistor has a gate which defines a resultant lateral expanse of semiconductive material therebeneath for provision of a transistor channel region, and where the transistor comprises an elevated source and an elevated drain, includes the following steps:

providing a conductive gate layer over a semiconductor substrate;

patterning the conductive gate layer into a first gate block, the first gate block having a first lateral expanse which is greater than the resultant lateral expanse;

providing an insulating dielectric layer over the first gate block;

providing a patterned layer of photoresist over the first gate block and the insulating dielectric layer, the patterned photoresist comprising a photoresist block positioned over and within the first lateral expanse of the first gate block;

with the patterned photoresist in place, etching the insulating dielectric layer selectively relative to the first gate block;

after etching the insulating dielectric layer and with the patterned photoresist in place, etching the first gate block selectively relative to the insulating dielectric layer to define a) the transistor gate, the transistor gate having opposing lateral edges defining a second lateral expanse therebetween adjacent the substrate which is equal to the resultant lateral expanse; and b) a pair of contact openings through the insulating dielectric layer adjacent the transistor gate, the contact openings each having one lateral edge which coincides with a respective lateral edge of the gate;

filling the contact openings with an electrically conductive plugging material to define an elevated source and an elevated drain of the transistor; and providing conductively doped regions within the semiconductor substrate adjacent the transistor gate, the plugging material having a higher electrical conductance than the substrate doped regions.

Referring to FIG. 1, a semiconductor wafer fragment in process is indicated generally with reference numeral 10. Such comprises a bulk semiconductor substrate region 12, typically and preferably comprising monocrystalline silicon. Substrate 12 is provided with a selected p- or n-doping, depending upon which of NMOS or PMOS field effect transistors are being formed in the illustrated substrate regions. A gate dielectric layer 14 is provided atop substrate 12, followed by provision of a conductive gate layer 16. Gate layer 16 preferably comprises an n-type conductively doped polysilicon layer 18 and an overlying $WSi_x$ layer 20.

Figure 2:
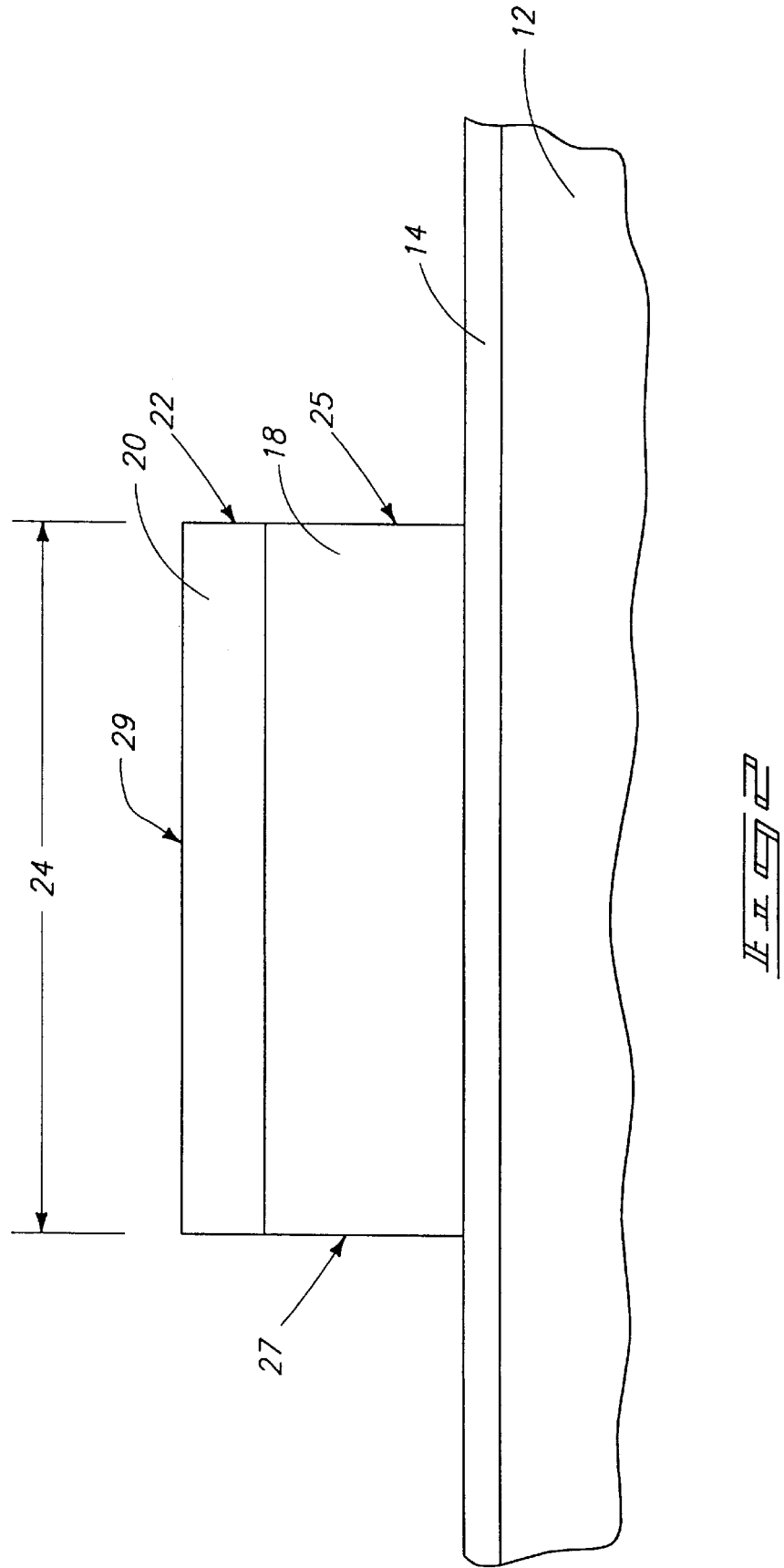
FIG. 2 is a view of the FIG. 1 wafer fragment at a processing step subsequent to that shown by FIG. 1.

Referring to FIGS. 2 and 8, conductive gate layer 16 is patterned and etched into a first gate block shape 22 having opposed lateral edges 25 and 27, and an outer surface 29. Such defines a first lateral expanse 24 which is greater than a resultant lateral expanse which will be provided by a finally patterned gate, as will be apparent from the continuing discussion.

Figure 3:
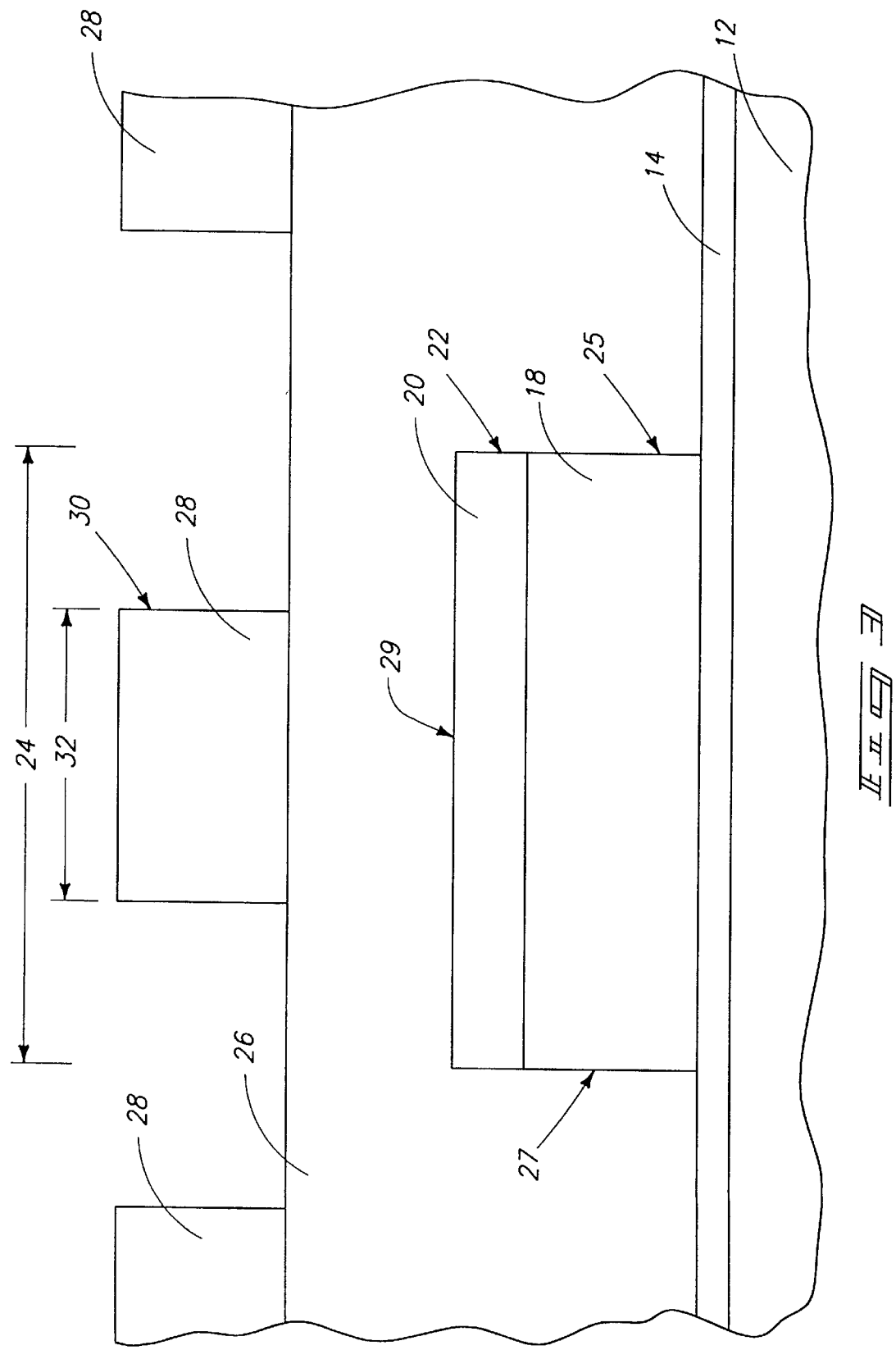
FIG. 3 is a view of the FIG. 1 wafer fragment at a processing step subsequent to that shown by FIG. 2.

Referring to FIGS. 3 and 8, an insulating dielectric layer 26, preferably BPSG, is provided over first gate block 22. Layer 26 is preferably provided to have an outer planarized surface as shown. A patterned layer of photoresist 28 is provided over first gate block 22 and insulating dielectric layer 26. Such comprises a photoresist block 30 positioned over gate block 22, and having a lateral expanse 32. Photoresist block lateral expanse 32 is equal to the resultant lateral expanse. Lateral expanse 32 is positioned within first lateral expanse 24 of first gate block 22. Photoresist layer 28 is also patterned as shown to expose portions of insulating dielectric layer 26 laterally outward of first gate block lateral edges 25 and 27.

Figure 4:
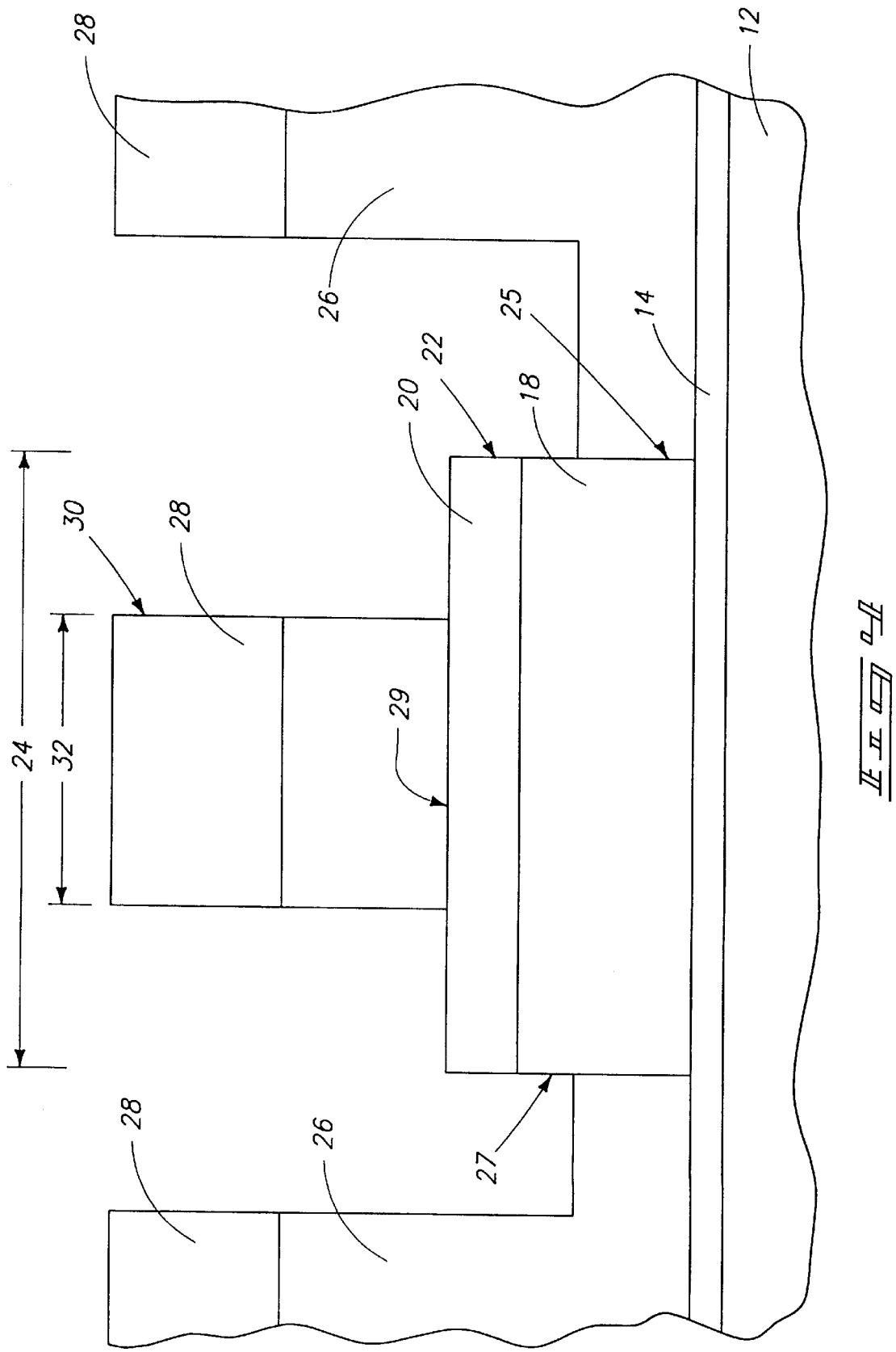
FIG. 4 is a view of the FIG. 1 wafer fragment at a processing step subsequent to that shown by FIG. 3.

Referring to FIG. 4, and with patterned photoresist layer 28 in place, insulating dielectric layer 26 is etched selectively in an anisotropic manner relative to the material of first gate block 22. Where layer 26 comprises BPSG and first gate block 22 is comprised of $WSi_x$ and polysilicon, example etch chemistries will utilize $CF_x$ or $CH_xF_y$ as the significant species for achieving the desired selectivity.

Figure 5:
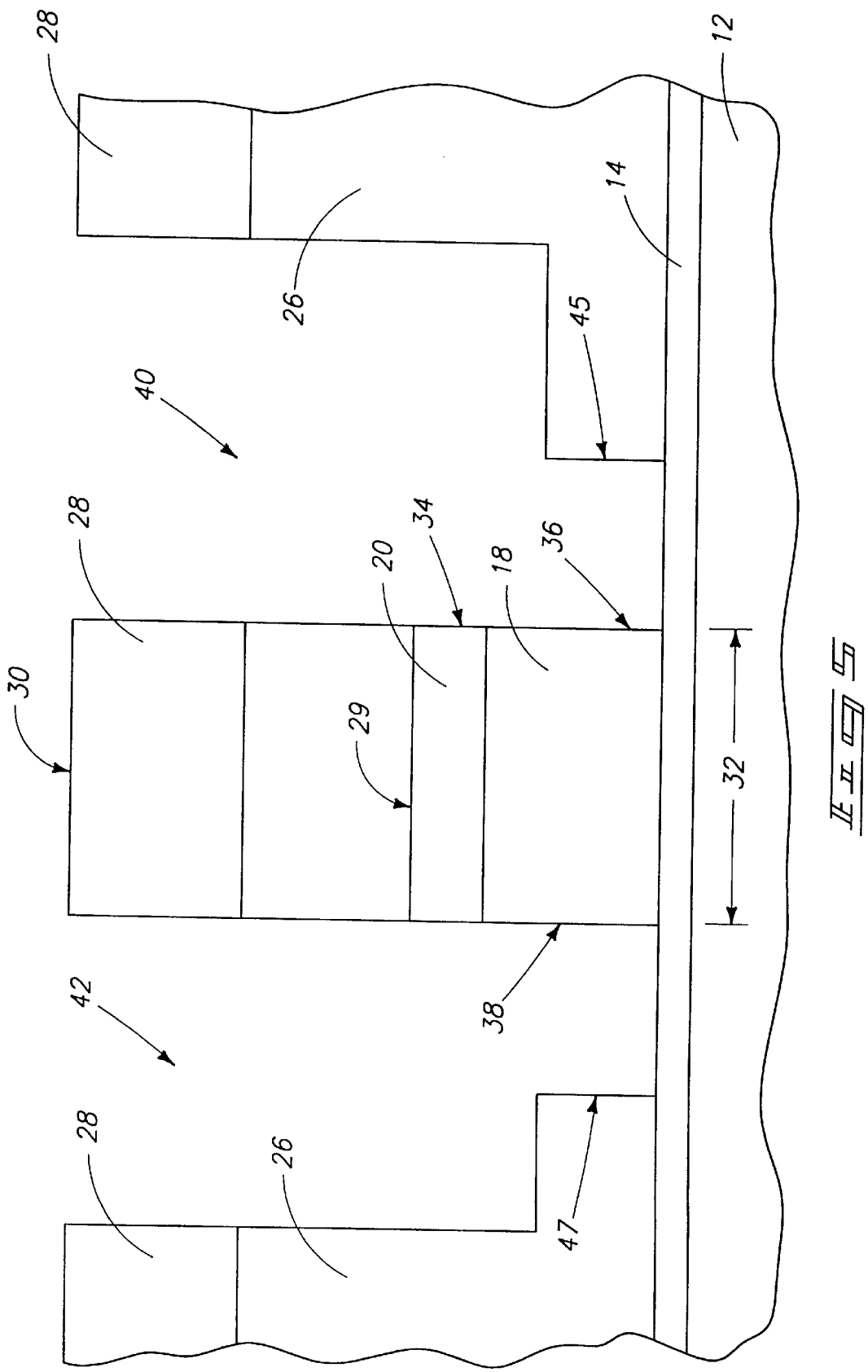
FIG. 5 is a view of the FIG. 1 wafer fragment at a processing step subsequent to that shown by FIG. 4.

Referring to FIGS. 5 and 8, the etch chemistry is changed to etch first gate block 22 selectively relative to insulating dielectric layer 26 and gate dielectric layer 14 to define a resultant transistor gate 34. The etching is conducted to etch insulating dielectric layer 26 inwardly beyond first gate block outer surface 29. Transistor gate 34 has a lateral expanse, at least adjacent substrate 12, which is equal to resultant lateral expanse 32. Transistor gate 34 also includes opposing outer lateral edges 36 and 38. For the above described materials for the insulating dielectric layer the gate and gate dielectric layer, an example etch chemistry utilized to produce the FIG. 5 construction would utilize Cl or Br to provide high selectivity relative to oxide. Accordingly in the preferred embodiment, the combined steps of etching insulating dielectric layer 26 and etching first gate block 22 includes definition of a pair of contact openings 40 and 42 through insulating dielectric layer 26 adjacent transistor gate 34. Each contact opening 40 and 42 has one lateral edge which coincides with the respective lateral edges 36 and 38 of transistor gate 34. Contact openings 40 and 42 are wider at their tops as compared to adjacent the substrate, defining outer opposed edges 45 and 47.

Figure 6:
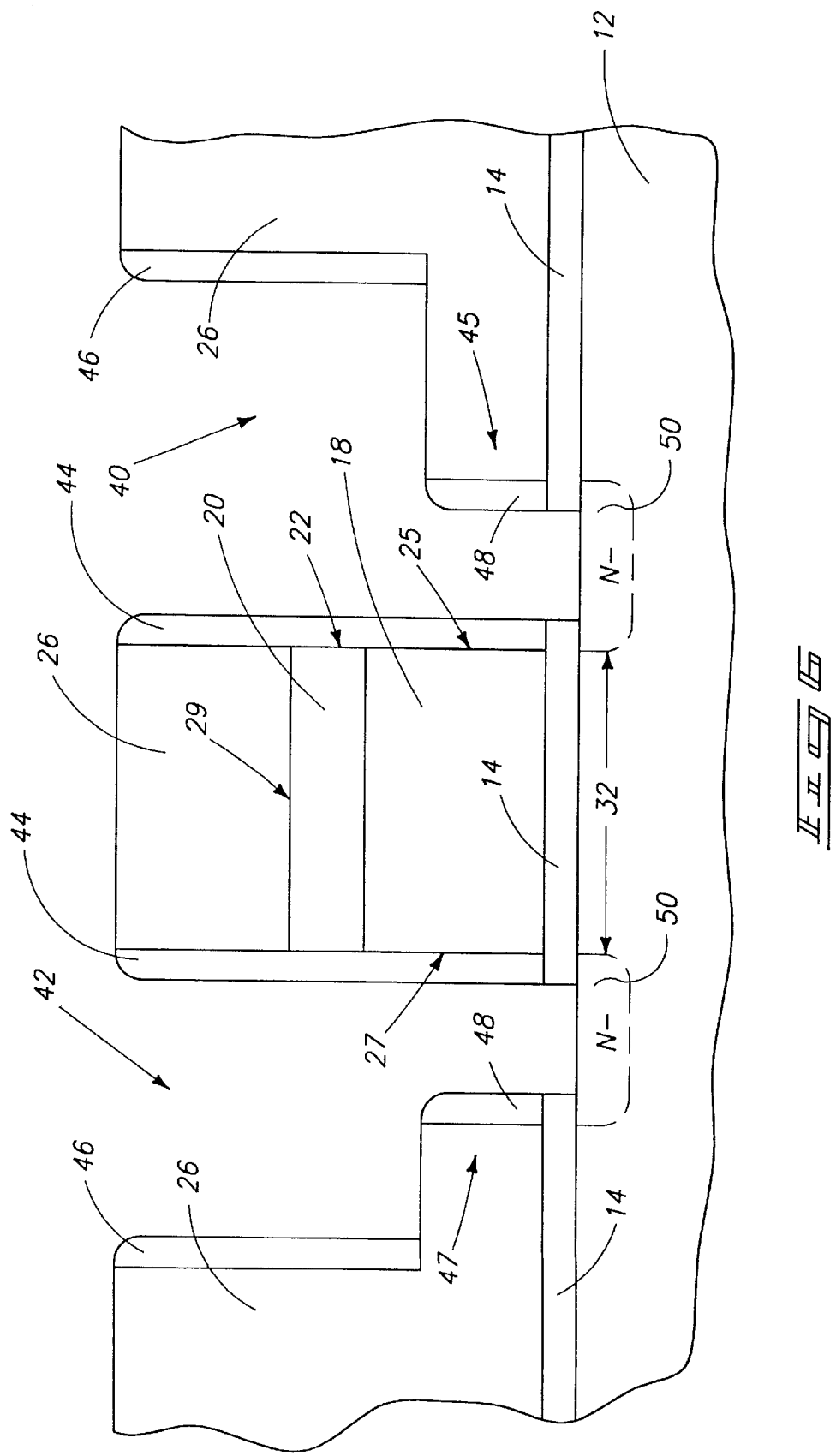
FIG. 6 is a view of the FIG. 1 wafer fragment at a processing step subsequent to that shown by FIG. 5.

Referring to FIGS. 6 and 8, an electrically insulative spacer layer is deposited to within the pair of contact openings 40 and 42 to less than completely fill such openings. Such a layer is anisotropically etched to define in a common etch step insulative spacers 44 about transistor gate opposing lateral edges 36 and 38, and insulative spacers 46, 48 within contact openings 40 and 42. Spacers 44, 46 and 48 are not shown in FIG. 8 for clarity. Spacers 44, 46 and 48 need not constitute a nitride material (but can be) due to etch alignment of the contact openings relative to the word line already having been established and completed. If forming an NMOS transistor, LDD regions 50 are preferably provided within bulk substrate 12 prior to provision of the spacer layer. Alternately, regions 50 might be heavily doped to constitute inherent source and drain regions. The spacer etch also preferably removes remnants of gate oxide layer 14 at the inner base of contact openings 40 and 42.

Referring to FIG. 7, contact openings 40 and 42 are filled with an electrically conductive plugging material to define conductive plugs 52 and 54. For example for formation of an NMOS field effect transistor having an elevated source and drain, regions 50 are provided to be n-doped and plugs 52 and 54 comprise epitaxial silicon deposited or grown relative to the substrate within the contact openings. Alternately, regions 50 might be heavily doped to provide the essential source and drains within substrate 14, with plugs 52 and 54 comprising, for example, polycrystalline silicon. Further, regions 50 could be provided by ion implanting, out-diffusion from heavily doped conductive plugs 52 and 54, or by other means. With an elevated source and drain construction, the plugging material of regions 54 and 52 will typically have a higher electrical conductance than substrate doped regions 50 and be in ohmic electrical contact therewith. Of course alternate conductive material could be utilized for conductive plugs 52, such as metals or suicides.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of patterning a conductive layer, comprising:

forming a conductive layer outwardly of a semiconductor material, the conductive layer having a first cross-sectional area;

forming an insulating dielectric material layer over the conductive layer;

providing a photoresist block over the insulating dielectric material layer, the photoresist block having a second cross-sectional area, the second cross-sectional area being less than the first cross-sectional area;

after providing the photoresist block, removing a portion of the insulating dielectric material layer to form a first material block having a second cross-sectional area and to expose a portion of the conductive layer; and removing the exposed portion of the conductive layer to pattern the conductive layer to a portion having the second cross-sectional area.

2. A method of forming a transistor gate, comprising:

forming a gate material outwardly of a semiconductor material, the gate material having a first cross-sectional area;

forming an insulative material over the gate material, the insulative material having a second cross-sectional area, the second cross-sectional area being less than the first cross-sectional area;

removing a portion of the gate material not covered by the insulative material to form a transistor gate having the second cross-sectional area; and wherein the transistor gate and the insulative material comprise a co-extensive lateral periphery and further comprising forming an insulative spacer along the co-extensive lateral periphery.

3. A method of forming a transistor gate, comprising:

forming a gate material outwardly of a semiconductor material, the gate material having a first lateral expanse;

forming a stack over the gate material, the stack comprising a photoresist material and an insulative material, the stack not covering a portion of the gate material; and removing the uncovered portion of the gate material to define a transistor gate having a second lateral expanse, the second lateral expanse being less than the first lateral expanse.

4. The method of claim 3 wherein the photoresist material is over the insulative material.

5. The method of claim 3 wherein the transistor gate and the insulative material comprise a co-extensive lateral periphery and further comprising forming an insulative spacer along the co-extensive lateral periphery.

6. A method of forming a field effect transistor, comprising:

forming a gate material outwardly of a semiconductor material, the gate material having a first cross-sectional area;

forming an insulative material over the gate material;

providing a photoresist material over the insulative material, the photoresist material having a second cross-sectional area, the second cross-sectional area being less than the first cross-sectional area;

after providing the photoresist material, removing a portion of the insulative material to reduce a cross-sectional area of the first material to the second cross-sectional area and to expose a portion of the gate material;

removing the exposed portion of the gate material to form: a) a transistor gate; and b) a pair of contact openings adjacent the transistor gate; and filling the pair of contact openings with an electrically conductive plugging material to define an elevated source and an elevated drain adjacent the transistor gate; the transistor gate, elevated source and elevated drain together comprising a field effect transistor.

7. The method of claim 6 wherein the electrically conductive plugging material is conductively doped with a conductivity enhancing impurity, the method further comprising providing the conductivity enhancing impurity adjacent the transistor gate by out-diffusing the conductivity enhancing impurity from the electrically conductive plugging material into the substrate adjacent the transistor gate.

8. A method of forming a field effect transistor relative to a semiconductor substrate, the transistor having a transistor gate which defines a resultant lateral expanse of semiconductive material therebeneath for provision of a transistor channel region, the method comprising:

providing a conductive gate layer over the semiconductor substrate;

patterning the conductive gate layer into a first gate material, the first gate material having a first lateral expanse which is greater than the resultant lateral expanse;

providing an insulating dielectric layer over the first gate material;

providing a layer of patterned photoresist over the first gate material and the insulating dielectric layer, the patterned photoresist being positioned over and within the first lateral expanse of the first gate material;

after providing the layer of patterned photoresist, etching the insulating dielectric layer;

after etching the insulating dielectric layer, etching the first gate material to define the transistor gate having a second lateral expanse adjacent the semiconductor substrate which is equal to the resultant lateral expanse; and providing a conductivity enhancing impurity into the semiconductor substrate adjacent the transistor gate.

* * * * *

UNITED STATES PATENT AND TRADEMARK OFFICE
CERTIFICATE OF CORRECTION

PATENT NO. : 6,083,799
DATED : July 4, 2000
INVENTOR(S) : Kirk Prall

It is certified that error appears in the above-identified patent and that said Letters Patent is hereby corrected as shown below:

Delete Drawing Fig 7 and substitute therefor the drawing sheet, consisting Fig 7 as shown on the attached page.

UNITED STATES PATENT AND TRADEMARK OFFICE
CERTIFICATE OF CORRECTION

PATENT NO : 6,083,799
DATED : July 4, 2000
INVENTOR(S) : Kirk Prall

It is certified that error appears in the above-identified patent and that said Letters Patent are hereby corrected as shown below:

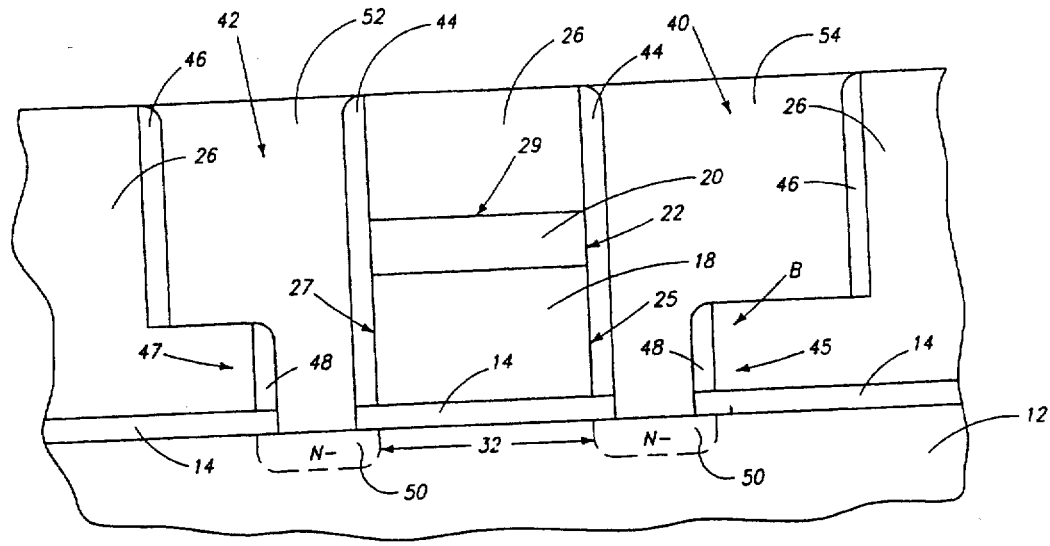

FIG. 2

Signed and Sealed this

Tenth Day of April, 2001

Attest:

NICHOLAS P. GODICI

Attesting Officer

Acting Director of the United States Patent and Trademark Office